(12) United States Patent
Kim et al.

(10) Patent No.: US 7,919,796 B2
(45) Date of Patent: *Apr. 5, 2011

(54) IMAGE SENSOR AND METHOD OF MANUFACTURING THE SAME

(75) Inventors: Ju Hyun Kim, Chungcheongnam-do (KR); Jae Hyun Kang, Suwon-si (KR)

(73) Assignee: Dongbu HiTek Co., Ltd., Seoul (KR)

(*) Notice: Subject to any disclaimer, the term of this patent is extended or adjusted under 35 U.S.C. 154(b) by 115 days.

This patent is subject to a terminal disclaimer.

(21) Appl. No.: 12/265,660

(22) Filed: Nov. 5, 2008

(65) Prior Publication Data

US 2009/0127599 A1    May 21, 2009

(30) Foreign Application Priority Data

Nov. 16, 2007    (KR) .................... 10-2007-0117030

(51) Int. Cl.
*H01L 31/062* (2006.01)
*H01L 31/113* (2006.01)
*H01L 31/036* (2006.01)
*H01L 27/148* (2006.01)
*H01L 29/768* (2006.01)

(52) U.S. Cl. ........... 257/292; 257/72; 257/291; 257/233

(58) Field of Classification Search .................. 257/292, 257/290, 72, 215, 218, 214, 226, 228, 232, 257/242, 291, 293, 294
See application file for complete search history.

(56) References Cited

U.S. PATENT DOCUMENTS

| 7,436,038 B2 * | 10/2008 | Engelmann et al. .......... 257/444 |
| 2009/0065831 A1 * | 3/2009 | Lee ............................... 257/292 |

* cited by examiner

*Primary Examiner* — Chuong A. Luu
(74) *Attorney, Agent, or Firm* — The Law Offices of Andrew D. Fortney; Andrew D. Fortney; William K. Nelson

(57) ABSTRACT

Provided is an image sensor. The image sensor includes a semiconductor substrate, an interlayer dielectric, metal interconnections, a first electrode, a lower electrode, a second electrode, and a photodiode. The semiconductor substrate has at least one transistor thereon. The interlayer dielectric is on the semiconductor substrate. The metal interconnections pass through the interlayer dielectric. The first electrode is in the interlayer dielectric between the metal interconnections. The lower electrode is on the interlayer dielectric to connect to the metal interconnection. The second electrode is on the interlayer dielectric at a position corresponding to the first electrode, and a gap region is between the second electrode and the lower electrode. The photodiode is on the interlayer dielectric with the lower electrode and the second electrode.

20 Claims, 4 Drawing Sheets

IMAGE SENSOR AND METHOD OF MANUFACTURING THE SAME

CROSS-REFERENCE TO RELATED APPLICATIONS

The present application claims priority under 35 U.S.C. 119 to Korean Patent Application No. 10-2007-0117030 (filed on Nov. 16, 2007), which is hereby incorporated by reference in its entirety.

BACKGROUND

Embodiments of the invention relate to an image sensor and a method of manufacturing the image sensor.

An image sensor is a semiconductor device converting an optical image into electrical signals. Image sensors may be classified into a charge coupled device (CCD) image sensor and a complementary metal oxide silicon (CMOS) image sensor (CIS).

A unit pixel of a CMOS image sensor includes a photodiode and one or more metal oxide silicon (MOS) transistors. Therefore, the CMOS image sensor sequentially detects an electrical signal of the unit pixel in a switching manner to generate an image. The CIS includes a photodiode region converting a light signal into an electrical signal and a transistor processing the electric signal, and the photodiode region and the transistor are horizontally arranged.

The photodiode of the horizontal type CIS is horizontally adjacent to the transistor on the substrate. Therefore, an additional region is required for forming the photodiode region, thereby reducing a fill factor and limiting resolution.

SUMMARY

Embodiments provide an image sensor and a method of manufacturing the same, which can prevent crosstalk and noise simultaneously with employing a vertical-type photodiode.

In one embodiment, an image sensor comprises a semiconductor substrate comprising one or more transistors thereon; a dielectric on the semiconductor substrate; a plurality of metal interconnections passing through the dielectric, each metal interconnection corresponding to a unit pixel; a first electrode in the dielectric between adjacent metal interconnections; a lower electrode on the dielectric, connected to the metal interconnection; a second electrode on the dielectric at a position corresponding to the first electrode; a gap region between the second electrode and the lower electrode; and a photodiode on the dielectric (e.g., on the lower electrode and the second electrode and in the gap region).

In another embodiment, a method of manufacturing an image sensor comprises forming a dielectric on a semiconductor substrate comprising one or more transistors; forming a metal interconnection corresponding to a unit pixel and passing through the dielectric; forming a first electrode in the dielectric between adjacent metal interconnections; forming a lower electrode and a second electrode on the dielectric, the lower electrode connected to the metal interconnection and the second electrode at a position corresponding to the first electrode, a gap region being between the second electrode and the lower electrode; and forming a photodiode on the dielectric (e.g., on the lower electrode and the second electrode, and in the gap region).

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

An exemplary image sensor and method of manufacturing the same according to embodiments of the invention will now be described in detail with reference to the accompanying drawings.

Figure 6:
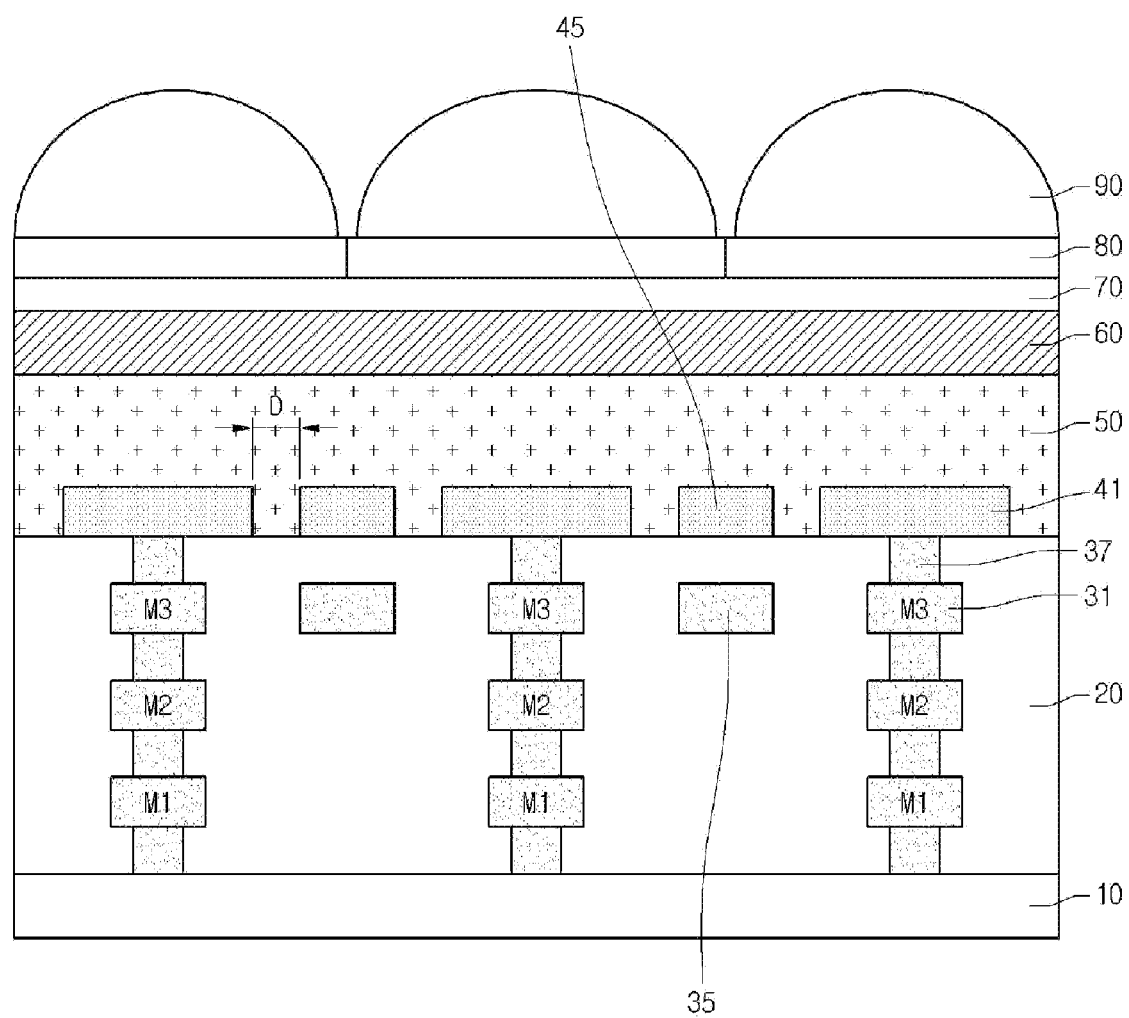

FIG. 6 is a cross-sectional view illustrating the exemplary image sensor.

Referring to FIG. 6, dielectrics 20 including metal interconnections 31 are on a semiconductor substrate 10.

Although not shown, a unit pixel may include a transistor circuitry on the semiconductor substrate 10. The transistor circuitry is connected to a photodiode that will be described and converts received photoelectric charges into electric signals. The transistor circuitry may include a plurality of transistors per unit pixel, for example 3 (e.g., a 3Tr unit pixel), 4 (e.g., a 4Tr unit pixel), or 5 (e.g., a 5Tr unit pixel).

The interlayer dielectrics 20 may include a plurality of layers. For example, the interlayer dielectrics 20 may include an oxide layer or a nitride layer. Each of the plurality of dielectric layers may correspond to a metal interconnection 31. Each dielectric layer may comprise a lowermost, conformal etch stop layer (e.g., silicon nitride), a conformal buffer and/or gap-fill layer (e.g., silicon-rich oxide [SRO], TEOS [e.g., a silicon oxide formed by CVD from tetraethyl orthosilicate and oxygen], an undoped silicate glass [USG] or a combination thereof), a bulk dielectric layer (e.g., one or more silicon oxide layers doped with fluorine [e.g., a fluorosilicate glass or FSG], boron and/or phosphorus [BSG, PSG and/or BPSG]), and a capping layer (e.g., of TEOS, USG, a plasma silane [e.g., silicon dioxide formed by plasma-assisted CVD of silicon dioxide from silane and oxygen], or a combination thereof, such as a bilayer of plasma silane on USG or TEOS, or a bilayer of USG on TEOS).

The metal interconnections 31 (M1, M2 and M3) for connection to a power line or a signal line are generally surrounded by interlayer dielectrics 20. Each metal interconnection 31 (e.g., M1, M2, M3) may comprise sputter-deposited aluminum or aluminum alloy (e.g., Al with up to 4 wt. % Cu, up to 2 wt. % Ti, and/or up to 1 wt. % Si), on conventional adhesion and/or barrier layers (e.g., Ti and/or TiN, such as a TiN-on-Ti bilayer), and/or covered by conventional adhesion, barrier, hillock suppression, and/or antireflective layers (e.g., Ti, TiN, WN, TiW alloy, or a combination thereof, such as a TiN-on-Ti bilayer or a TiW-on-Ti bilayer). The metal interconnections 31 (M1, M2 and M3) correspond to (or are disposed by) the unit pixel. The metal interconnections 31 are in and/or on each layer of the interlayer dielectrics 20, and are electrically connected to each other through via-contacts 37. The contacts/vias (e.g., 37) between the metal lines 31 may each comprise tungsten (deposited by chemical vapor deposition [CVD]) or aluminum or aluminum alloy (e.g., as described above, deposited by sputtering), on conventional adhesion and/or barrier layers (e.g., Ti and/or TiN, such as a TiN-on-Ti bilayer). The Ti, TiN and TiW layers may be deposited by CVD or sputtering.

A first electrode 35 is disposed between the metal interconnections 31 (M3) in a top layer of the metal interconnections 31. Alternatively, the first electrode 35 may be between metal interconnections in a different layer of metallization (e.g., M2 or M1, or a higher layer if the CIS device contains additional layers of metallization).

Although not shown, the metal interconnections 31 and the first electrode 35 may be connected to a peripheral signal-processing circuitry such that a voltage is applied thereto. At this point, a positive voltage (+) may be applied to the metal interconnections 31 and the first electrode 35.

The metal interconnections 31 and the first electrode 35 may be formed of the same material. For example, the metal interconnections 31 and the first electrode 35 may be formed of any one of various conductive materials including a metal, an alloy or silicide, that is, aluminum, copper, cobalt, and/or tungsten, or a silicide thereof.

Lower electrodes 41 and a second electrode 45 are on the interlayer dielectrics 20, including the metal interconnections 31 and the first electrode 35. The lower electrodes 41 and the second electrode 45 may comprise the same material. For example, the lower electrodes 41 and the second electrode 45 may include one or more layers or components comprising Cr, Ti, TiW and/or Ta.

The lower electrodes 41 are electrically connected to the metal interconnections 31 through a via or contact 37. Thus, each of the lower electrodes 41 corresponds to a unit pixel.

Figure 4:
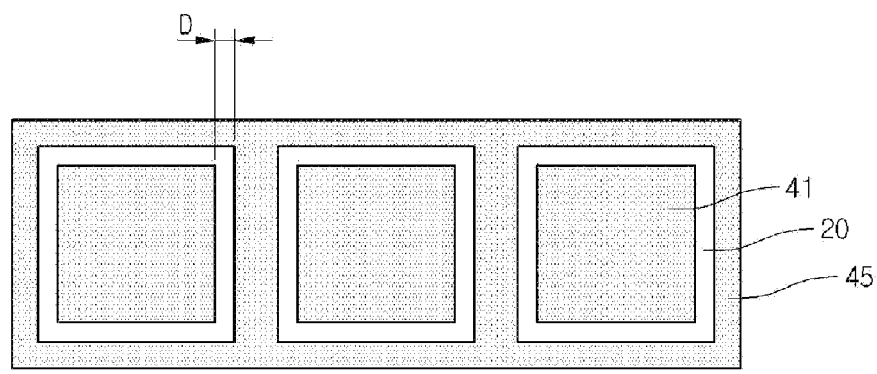
FIG. 4 is a plan view of FIG. 3.

The second electrode 45 is disposed on the interlayer dielectrics 20 over the first electrode 35 and separated from the first electrode 35. Also, the second electrode 45 is separated from the lower electrode 41 with a gap region D therebetween. That is, as illustrated in FIG. 4, the second electrode 45 with the gap region D may surround the lower electrodes 41. The lower electrodes 41 may have a relatively large area such that large numbers of electrons are delivered to the metal interconnections 31.

The photodiode is disposed on the interlayer dielectric 20 (e.g., on both the lower electrodes 41 and the second electrode 45, and in the gap region).

The photodiode includes an intrinsic layer 50 and a conductive layer 60. For example, the intrinsic layer 50 may include intrinsic amorphous silicon, and the conductive layer 60 may include p-type amorphous silicon.

When light is incident to the photodiode, the photodiode performs photoelectric conversion to generate photoelectrons. A positive voltage (+) is applied to the metal interconnections 31 and the first electrode 35, and the positive voltage (+) is also applied to the lower electrodes 41 connected to the metal interconnections 31, and thus the lower electrodes 41 collect the photoelectrons of the photodiode. At this point, since the second electrode 45 disposed on the first electrode 35 is separated from the first electrode 35, the second electrode 45 relatively has a negative polarity. Thus, the electrons of the photodiode are not delivered to an upper portion of the second electrode 45, so that the electrons of the photodiode are just collected into the lower electrode 41 of the relevant unit pixel.

An upper electrode 70 is disposed on the photodiode. The upper electrode 70 may include a transparent electrode having excellent light transmittance and high conductivity. For example, the upper electrode 70 may be formed of any one of indium tin oxide (ITO), cadmium tin oxide (CTO), and $ZnO_2$.

Color filters 80 and microlenses 90 are disposed on the upper electrode 70.

As described above, the photodiode and the semiconductor substrate including the transistor circuitry are vertically integrated to improve the fill factor of the image sensor. Also, the photodiode (and, optionally, the unit pixel) is separated by the first and second electrodes, to prevent crosstalk and noise.

Hereinafter, according to various embodiments, an exemplary method of manufacturing an image sensor will now be described with reference to FIGS. 1 to 6.

Figure 1:
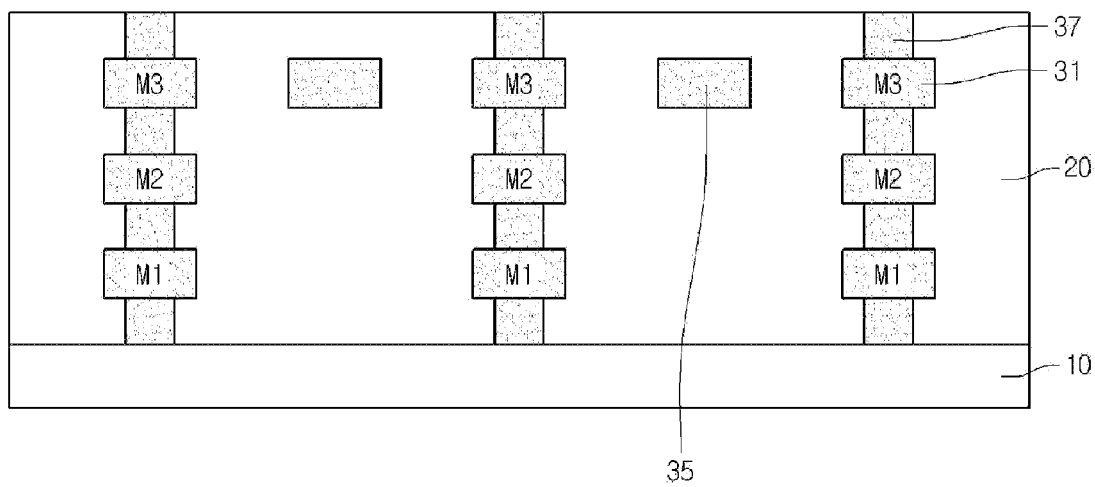
FIGS. 1 to 3 and FIGS. 5 and 6 are cross-sectional views illustrating an exemplary process of manufacturing an image sensor according to various embodiments.

Referring to FIG. 1, interlayer dielectrics 20 and metal interconnections 31 are formed on a semiconductor substrate 10 in accordance with known techniques.

Although not shown, a unit pixel may include complementary metal oxide silicon (CMOS) circuitry on the semiconductor substrate 10. The CMOS circuitry is connected to a photodiode that will be described below and that converts received photoelectric charges into electric signals. For example, the CMOS circuitry may include a 3Tr, 4Tr or 5Tr unit pixel.

The interlayer dielectrics 20 may be formed on the semiconductor substrate 10 and include the metal interconnections 31 for connection to a power line or a signal line and have a plurality of layers. In this embodiment, the interlayer dielectrics 20 are provided in a triple layered structure, and the metal interconnections 31 (M1, M2 and M3) may be provided on or in layers of interlayer dielectrics 20. Also, the interlayer dielectrics 20 may include an oxide layer or a nitride layer. Also, the metal interconnections 31 may be formed of any one of various conductive materials including a metal, an alloy or salicide (e.g., aluminum, copper, cobalt, tungsten, or a silicide, nitride or alloy thereof).

The metal interconnections 31 are formed on the interlayer dielectrics 20 adjacent to or in the unit pixel, which delivers photoelectrons generated in the photodiode to the CMOS circuitry of the semiconductor substrate 10. Although not shown, the metal interconnections 31 may be connected to an impurity-doped region formed in the semiconductor substrate 10. Also, the metal interconnections 31 may be connected to a peripheral signal-processing circuitry such that a voltage is applied thereto. For example, a voltage applied to the metal interconnections 31 may be a positive voltage (+).

A first electrode 35 is simultaneously formed with at least one of the metal interconnections 31. In one embodiment, the first electrode 35 may be formed simultaneously with the metal interconnection 31 (M3) disposed in the top layer of the metal interconnections 31. The first electrode 35 may be formed by the same method and with the same material as those of the metal interconnections 31. For example, the metal interconnections 31 and the first electrode 35 may be formed using a PVD or damascene process.

The first electrode 35 is formed between the metal interconnections 31 and is spaced apart from the metal interconnections 31. Although not shown, the first electrode 35 may be connected to a peripheral signal-processing circuitry such that a voltage is applied to the first electrode 35. For example, a voltage applied to the first electrode 35 may be a positive voltage (+).

Vias and/or contacts 37, electrically connected to the metal interconnections 31, are also formed in the interlayer dielectrics 20 in accordance with known techniques. The vias/contacts 37 are electrically connected to the metal interconnections 31 to deliver photoelectrons from the photodiode to the metal interconnections 31. For example, the vias/contacts 37 may comprise various conductive materials including a metal, an alloy or salicide.

The vias/contacts 37 may be provided by forming via holes in a layer of the interlayer dielectric 20, including a layer over the uppermost metal interconnection 31, and then filling the via holes with a metal material. Thus, surfaces of the vias/contacts 37 on the metal interconnections 31 are exposed in a surface of the interlayer dielectrics 20.

At this point, the first electrode 35 is formed in a same layer as at least one of the metal interconnections 31. Consequently, a portion of the interlayer dielectric 20 may be formed on the first electrode 35 having a height of the via/contact 37.

Figure 2:
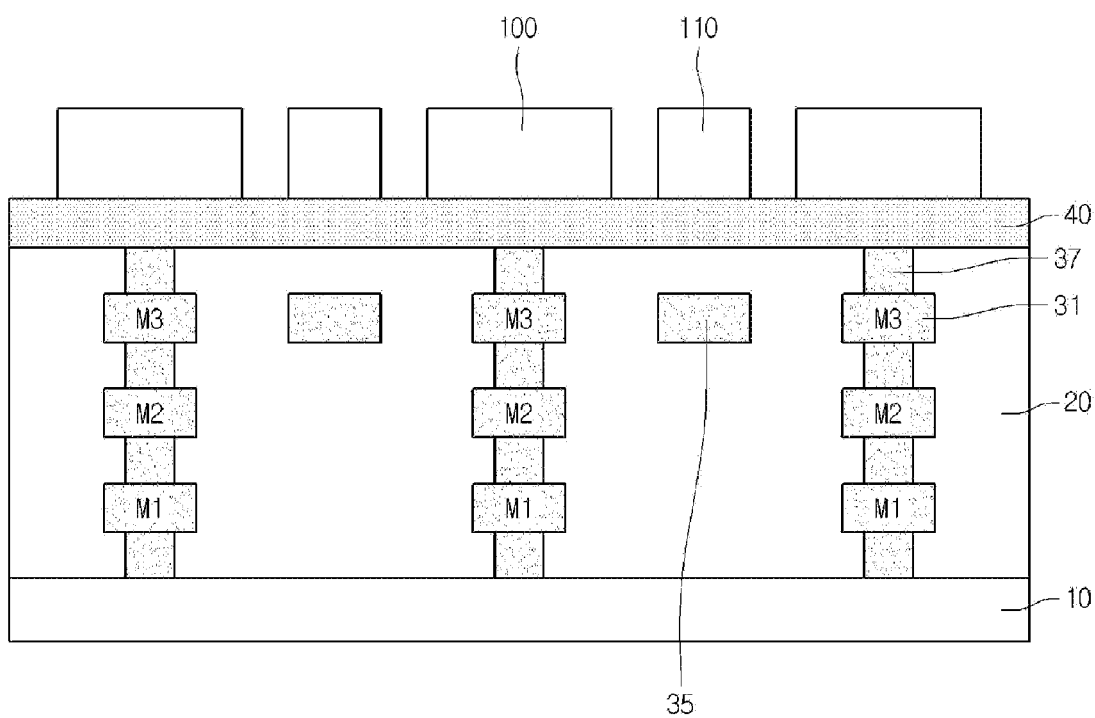

Referring to FIG. 2, a lower electrode layer 40 is formed on the interlayer dielectrics 20, including the metal interconnections 31 and the first electrode 35. The lower electrode layer 40 is to be electrically connected to the metal interconnections 31 through the via-contacts 37. For example, the lower electrode layer 40 may comprise a metal such as Cr, Ti, TiW and/or Ta, and be deposited by a PVD method.

Figure 3:
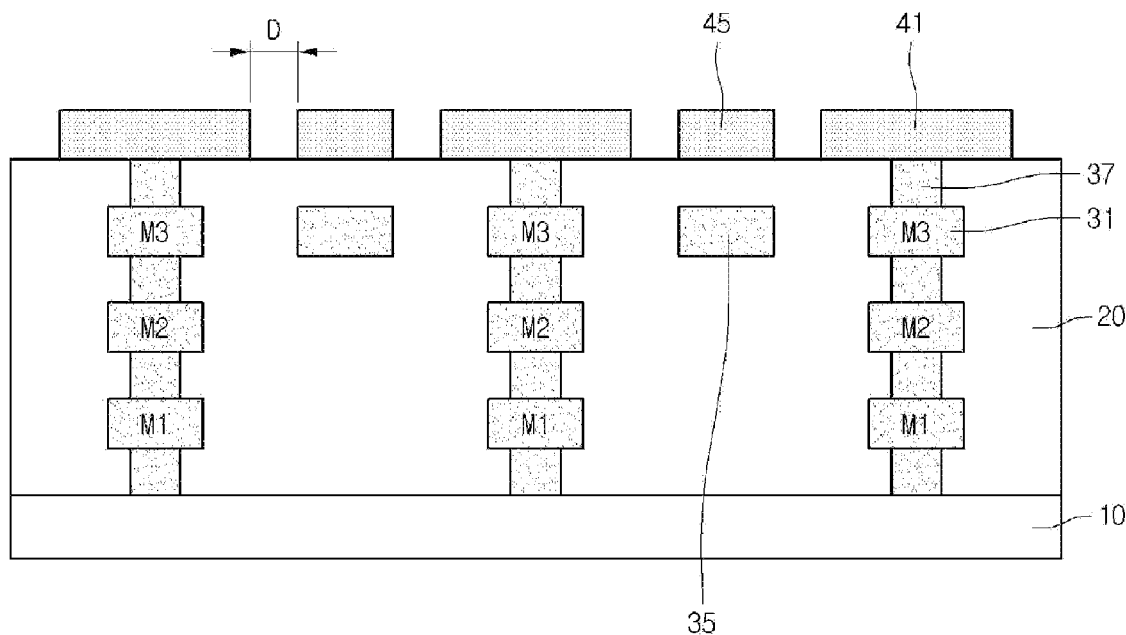

Referring to FIGS. 3 and 4, lower electrodes 41 and a second electrode 45 are patterned on the interlayer dielectrics 20. The lower electrodes 41 are formed on the vias/contacts 37, electrically connected to the metal interconnections 31. The lower electrodes 41 may correspond in a 1:1 relationship with the unit pixels.

The second electrode 45 may be formed at a corresponding position to the first electrode 35. Here, the lower electrodes 41 are spaced apart from the second electrode 45, to define a gap region D. Also, the second electrode 45 may have a width corresponding to a width between microlenses that will be formed later. For example, the second electrode 45 may have a width ranging about 100 nm to 200 nm.

The second electrode 45 is formed on the interlayer dielectrics 20 over the first electrode 35, and thus may have the same inter-feature distance as a distance between adjacent first electrodes 35 and/or adjacent vias and/or contacts 37. Also, the second electrode 45 is spaced a distance, corresponding to the gap region D, from the lower electrodes 41.

Referring again to FIG. 2, photoresist patterns 100 and 110 are formed on the lower electrode layer 40 to form the lower electrodes 41 and the second electrode 45. The photoresist patterns 100 and 110 may cover the lower electrode layer 40 in regions corresponding to the metal interconnections 31 and the first electrode 35, but expose the other region(s) of the lower electrode layer 40. Then, the lower electrode layer 40 is etched using the photoresist patterns 100 and 110 as an etch mask. Thus, the lower electrodes 41 connected to the metal interconnections 31 through the vias/contacts 37, and the second electrode 45 corresponding to the first electrode 35, are formed on the interlayer dielectrics 20. Also, the gap regions D are formed between the lower electrodes 41 and the second electrode 45, to selectively expose the interlayer dielectrics 20.

FIG. 4 is a plan view of FIG. 3. Referring to FIG. 4, the second electrode 45 may surround the lower electrodes 41 with the interposed gap regions D. The lower electrodes 41 may have a relatively large area (e.g., as compared to a corresponding photodiode formed in silicon, as in a more conventional CMOS image sensor) to deliver large numbers of electrons to the metal interconnections 31. Also, the second electrode 45 for device isolation may have a less area than the lower electrodes 41.

The first electrode 35 is formed between the metal interconnections 31, and the second electrode 45 is formed between the lower electrodes 41, such that the photodiode, to be formed later, correspond to the unit pixel. This employs a principal where photoelectrons of the photodiode are collected into only the lower electrodes 41 using a voltage difference between the lower electrodes 41 and the second electrode 45.

Figure 5:
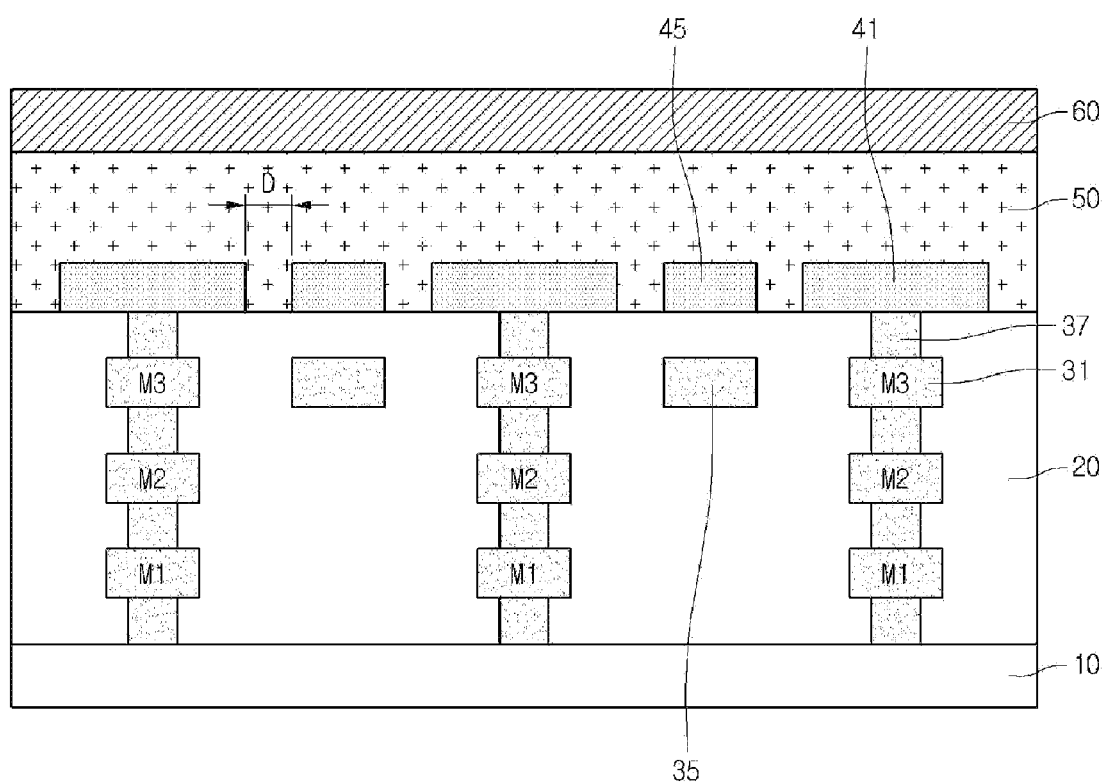

Referring to FIG. 5, the photodiode is formed on the interlayer dielectrics 20, the lower electrodes 41 and the second electrode 45, to connect to the metal interconnections 31.

In this embodiment, an IP diode is used as the photodiode. The IP diode includes a metal, intrinsic amorphous silicon, and p-type amorphous silicon that are in contact with each other. Particularly, the I-P diode is a photodiode, in which the intrinsic amorphous silicon, as a pure semiconductor, is between the p-type amorphous silicon and the metal. The intrinsic amorphous silicon forms a depletion region to improve the generation and the storage of electric charges. The photodiode may have a P-I-N, N-I-P or I-P structure.

In this embodiment, the photodiode having the I-P structure is exemplified. A layer of the intrinsic amorphous silicon is referred to as an intrinsic layer 50, and a layer of the p-type amorphous silicon is referred to as a conductive layer 60.

Referring to FIG. 5, the intrinsic layer 50 is formed on the interlayer dielectrics 20, the lower electrodes 41 and the second electrode 45. The intrinsic layer 50 may serve as an I-layer of the I-P diode according to this embodiment. Although not shown, n-type amorphous silicon may be formed on the lower electrodes 41 and the second electrode 45 (and in the gap region) before forming the intrinsic layer 50.

The intrinsic layer 50 may comprise intrinsic amorphous silicon. For example, the intrinsic layer 50 may be formed at a temperature ranging from about 100° C. to 200° C. using a PECVD method and a silane gas (e.g., $SiH_4$). At this point, the intrinsic layer 50 may fill the gap regions D.

The intrinsic layer 50 may have a thickness about 10 to 1000 times greater than that of the conductive layer 60. Accordingly, as the thickness of the intrinsic layer 50 is increased, the depletion region of the I-P diode is also increased to improve the generation and storage of many photoelectric charges.

The conductive layer 60 is formed on the intrinsic layer 50, and may be formed sequentially following the formation of the intrinsic layer 50. The conductive layer 60 may serve as a p-layer according to various embodiments. That is, the conductive layer 60 may be a p-type conductive layer, but is not limited thereto. For example, the conductive layer 60 may comprise p-doped amorphous silicon, and be deposited by mixing a borane (e.g., $BH_3$ or $B_2H_6$) gas with a silane gas (e.g., $SiH_4$) and performing PECVD.

Thus, the photodiode including the intrinsic layer 50 and the conductive layer 60 is vertically integrated on the semiconductor substrate 10, thereby achieving a fill factor of the photodiode close to 100%.

Also, the photodiode is electrically separated into unit pixels to prevent crosstalk and noise. When a voltage is applied to the lower electrode 41, and light is incident to the photodiode, photoelectrons generated in the photodiode are collected in the lower electrode 41 and delivered to the metal interconnections 31. In one embodiment, a positive voltage (+) is applied to the lower electrodes 41 and the first electrode 35. When the plus voltage (+) is applied to the first electrode 35, the second electrode 45 has a negative polarity. In the state where the first electrode 35 and the second electrode 45 are insulated by the interlayer dielectrics 20, when the positive voltage (+) is applied to the lower electrodes 41 and the first electrode 35, the second electrode 45 has a relatively negative polarity. This is because the second electrode 45 is insulated from the first electrode 35 and the lower electrode 41, and thus the voltage is not applied to the second electrode 45.

When the second electrode 45 has the negative polarity, the second electrode 45 serves as an electron-blocking layer, so that electrons cannot move to an upper portion of the second electrode 45. Thus, the photodiode is electrically separated to correspond to respective unit pixels by the second electrode 45, so that the photoelectrons generated in the photodiode are collected into the lower electrode 41 of only the corresponding unit pixel, to prevent crosstalk and noise.

Referring to FIG. 6, an upper electrode 70 is formed on the photodiode. The upper electrode 70 may include a transparent electrode having excellent light transmittance and high conductivity. For example, the upper electrode 70 may comprise any one or more of indium tin oxide (ITO), cadmium tin oxide (CTO), and $ZnO_2$.

Color filters 80 and microlenses 90 may be further formed on the upper electrode 70 corresponding to a unit pixel. Particularly, when forming the microlenses 90 per unit pixel, the microlenses 90 may be spaced apart from each other to prevent a bridge phenomenon.

According to embodiments of the invention, the image sensor and method of manufacturing the same provide vertical integration of the transistor circuitry and the photodiode. Also, a fill factor close to 100% can be achieved through the vertical integration of the CMOS circuitry and the photodiode.

Also, through the vertical integration, a high sensitivity can be achieved in the same pixel size as that of conventional sensors.

Also, the respective unit pixels can form more complicated or complex circuitry without loss of the sensitivity.

Also, in forming the unit pixel of the photodiode, the surface area of the photodiode in the unit pixel can be increased, thereby improving light sensitivity.

Also, the photodiode is electrically separated into a predetermined unit pixel by the first and second electrodes, thereby preventing crosstalk and noise in the image sensor.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
a semiconductor substrate comprising one or more transistors;
a dielectric on the semiconductor substrate;
metal interconnections through the dielectric;
a first electrode in the dielectric between adjacent metal interconnections;
a lower electrode on the dielectric, connected to one of the metal interconnections;
a second electrode on the dielectric at a position corresponding to the first electrode;
a gap region between the second electrode and the lower electrode; and
a photodiode on the lower electrode and the second electrode.

2. The image sensor according to claim 1, wherein the metal interconnections and the first electrode comprise a same material.

3. The image sensor according to claim 1, wherein the lower electrode and the second electrode comprise a same material.

4. The image sensor according to claim 1, wherein the second electrode surrounds the gap region and the lower electrode.

5. The image sensor according to claim 1, wherein the metal interconnections and the first electrode are configured to receive a positive voltage, and the second electrode is configured to receive a negative voltage.

6. The image sensor according to claim 1, further comprising an upper electrode on the photodiode.

7. The image sensor according to claim 1, wherein the photodiode is also on the dielectric.

8. The image sensor according to claim 7, wherein the photodiode is in the gap region.

9. The image sensor according to claim 1, wherein the metal interconnections comprise multiple metallization layers, including an upper metallization layer and a lower metallization layer.

10. The image sensor according to claim 9, wherein the multiple metallization layers are connected by metal vias.

11. The image sensor according to claim 9, wherein the upper metallization layer is horizontally aligned with the first electrode.

12. The image sensor according to claim 1, wherein the second electrode is vertically aligned with the first electrode.

13. The image sensor according to claim 9, wherein each of the multiple metallization layers comprises a layer of aluminum or aluminum alloy, and a barrier layer comprising titanium and/or titanium nitride.

14. The image sensor according to claim 1, wherein the first electrode and the second electrode are electrically isolated from each other.

15. The image sensor according to claim 1, wherein the photodiode comprises a semiconductor layer and a conductive layer over the semiconductor layer.

16. The image sensor according to claim 15, wherein the semiconductor layer comprises amorphous silicon.

17. The image sensor according to claim 15, wherein the conductive layer comprises p-type amorphous silicon.

18. The image sensor according to claim 6, further comprising a color filter layer over the upper electrode.

19. The image sensor according to claim 18, further comprising microlenses over the color filter layer.

20. The image sensor according to claim 9, wherein the dielectric comprises multiple dielectric layers, each dielectric layer corresponding to one of the multiple metallization layers.

* * * * *